United States Patent
Wu (10) Patent No.: US 7,348,855 B2
(45) Date of Patent: Mar. 25, 2008

(54) BIAS CIRCUITRY FOR CASCODE TRANSISTOR CIRCUIT

(75) Inventor: Dolly Y. Wu, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 146 days.

(21) Appl. No.: 11/393,235

(22) Filed: Mar. 30, 2006

(65) Prior Publication Data

US 2007/0229167 A1  Oct. 4, 2007

(51) Int. Cl.
*H03F 3/16* (2006.01)
*H03F 3/04* (2006.01)

(52) U.S. Cl. ...................... 330/300; 330/296
(58) Field of Classification Search ................ None
See application file for complete search history.

(56) References Cited

U.S. PATENT DOCUMENTS

| | | | | |
|---|---|---|---|---|
| 5,587,687 | A * | 12/1996 | Adams | 330/253 |
| 6,188,269 | B1 * | 2/2001 | Hauser | 327/540 |
| 6,265,929 | B1 * | 7/2001 | Hauser | 327/404 |
| 6,388,476 | B1 * | 5/2002 | Isobe et al. | 327/110 |
| 6,392,492 | B1 * | 5/2002 | Yuan | 330/311 |
| 6,531,923 | B2 * | 3/2003 | Burns | 330/296 |
| 6,664,842 | B1 * | 12/2003 | Pobanz | 327/436 |
| 6,693,492 | B2 * | 2/2004 | Desize | 330/283 |
| 6,917,336 | B2 * | 7/2005 | Rowser et al. | 343/701 |
| 6,924,701 | B1 * | 8/2005 | Bhandari | 330/252 |

FOREIGN PATENT DOCUMENTS

JP        61117920 A *  6/1986

OTHER PUBLICATIONS

"A Low-Voltage CMOS Bandgap Reference", Eric A. Vittoz and Oliver Neyroud, IEEE Journal of Solid-State Curcuits, vol. SC-14, No. 3, Jun. 1979, pp. 573-577.

(Continued)

*Primary Examiner*—Robert Pascal
*Assistant Examiner*—Krista M Flanagan
(74) *Attorney, Agent, or Firm*—Wade J. Brady, III; Frederick J. Telecky, Jr.

(57) ABSTRACT

An integrated circuit includes a composite transistor including at least a first transistor of a first technology type having a first group of intrinsic properties and a second transistor of a second technology type having a second group of the intrinsic properties, at least one of the intrinsic properties of the second group being substantially different than a corresponding intrinsic property of the first group, the second transistor having a first electrode coupled to a supply voltage, a second electrode coupled to a first electrode of the first transistor, and a control electrode coupled to a bias voltage conductor and also coupled to a control electrode and a second electrode of the first transistor. A source of bias current is coupled to the bias voltage conductor and is also coupled to the second electrode of the second transistor. A bias voltage across the composite transistor is produced on the bias voltage conductor to bias a cascode transistor of the first technology type. A signal transistor of the second technology type is coupled to the first electrode of the cascode transistor.

20 Claims, 2 Drawing Sheets

OTHER PUBLICATIONS

"High-Frequency CMOS Switched-Capacitor Filters for Communications Application", Choi et al.; IEEE Journal of Solid-State Circuits, vol. SC-18, No. 6, Dec. 1983, pp. 652-664.

"CMOS Low-Power Analog Circuit Design", Christian C. Enz and Eric A. Vittoz, Emerging Technologies, pp. 79-133.

"Introduction To CMOS Op-Amps and Comparators", Roubik Gregorian, John Wiley & Sons, Inc., 1999, pp. 48-63.

"Series-Parallel Association of FET's for High Gain and High Frequency Applications", Galup-Montoro et al., IEEE Journal of Solid-State Circuits, vol. 29, No. 9, Sep. 1994, pp. 1094-1101.

* cited by examiner

BIAS CIRCUITRY FOR CASCODE TRANSISTOR CIRCUIT

BACKGROUND OF THE INVENTION

The present invention generally relates to a bias-generating integrated circuit for optimally generating a voltage to bias cascode transistors, wherein biasing sets the operating point of a cascode transistor and a signal transistor being cascoded in a circuit in order to precisely control its small signal characteristics, such as its transconductandance and impedance.

Cascode transistors often exist in analog circuits such as amplifiers, voltage regulators, and current mirrors. For example, transistor 13 in subsequently described in FIG. 1E is the cascode transistor, and transistor 14 is referred to as the "signal transistor" being cascoded. Cascode transistors may be used to increase the gain of a signal transistor amplifier, protect or shield the signal transistor, reduce Miller effect, and/or increase output resistance. Bias circuitry for such a cascode transistor is generally optimal if it is both physically small and capable of providing a voltage bias value that is fairly constant, and also is capable of "tracking" the performance of the cascode transistor. The performance of the cascode transistor will vary over technology processes and/or over operating conditions. The large variation in performance of a circuit such as an amplifier is exacerbated when the cascode transistors and the signal transistors are of different "technology types". Therefore, the bias circuitry for the cascode transistor should effectively "track" characteristics not only of the cascode transistor, but also characteristics of the signal transistor. Integrated circuits often are fabricated using integrated circuit technologies which include multiple types of transistors to meet different performance conditions. For example, in the case of a MOSFET cascode transistor of a particular technology type, its gate voltage bias must be in a certain range for both the cascode transistor and the signal transistor of a different technology type to remain turned on properly over all expected operating conditions and process variations.

Some prior art bias voltage circuits include one or more diode-connected transistors and/or transistor voltage dividers where all of the transistors are of the same technology type.

The value of the bias voltage generated may vary widely over various integrated circuit operating conditions, such as over a wide temperature range, and/or over a wide range of integrated circuit fabrication process variations, and/or over a wide range of power supply voltage variations. Moreover, the prior art does not optimally provide bias voltages for multiple technology types of transistors.

Many integrated circuit (IC) technologies include multiple kinds of transistors. For example, applications involving high voltage power supplies such as for voltage regulators, power amplifiers, or for DSL and video applications it is typical to use an IC technology containing multiple kinds of transistors, for example transistors having different drain-source breakdown voltages, i.e. $V_{DS}$ breakdown voltages in the case of MOSFET transistors. The "signal transistors" which are intended to rapidly pass the signal being amplified usually have lower $V_{DS}$ breakdown voltages, whereas the associated cascode transistors may have very high $V_{DS}$ breakdown voltages so that a system including such transistors can tolerate the high power supply voltage and effectively protect the associated signal transistor from damage. Different "technology types" of transistor within a particular IC technology also have been used in low voltage integrated circuit applications, such as in wireless communication applications. For example, a low voltage integrated circuit chip may be manufactured using a technology which provides two different technology types of MOSFETs, one with a typical threshold voltage $V_T$ of approximately 300 millivolts and the other with a threshold voltage near zero volts.

The prior art methods of generating a bias voltage include using a single transistor in a diode configuration. For example, for applications in high voltage systems the cascode transistor needs to be biased with a large voltage, so the biasing diode-connected transistor needs to have its gate length L quite large compared to its gate width W, wherein its W/L ratio becomes non-optimally small. (The terms "gate length" and "gate width" of a field effect transistor are also commonly referred to as its "channel length" and "channel width", respectively, even though the channel length is not exactly identical to the gate length. The terms "gate length" and "gate width" as used in the claims are intended to encompass the terms "channel length" and "channel width", respectively.) Such cascode transistors generate bias voltages that tend to vary widely with respect to circuit performance, and also become non-optimal with respect to integrated circuit layout efficiency. If use of the $V_{GS}$ voltage (i.e., gate-to-source voltage) of a single connected transistor or diode-connected transistor is insufficient to provide the needed bias voltage magnitude, then the bias voltage generating circuitry may need to utilize a "stack" of connected transistors or diode-connected transistors to obtain the needed large bias voltage. Or, transistors may be used in conjunction with resistive voltage divider circuits as another way to generate adequately large bias voltages. In all such cases, the generated bias voltages typically vary widely with integrated circuit process parameters, power supply voltage variations, and temperature variations. The longer the stack or string of elements, the greater the variation because of non-ideal behaviors of each individual component within the stack. Therefore, the generated bias voltages typically do not optimally follow or "track" the $V_{GS}$ or $V_{DS}$ voltages generated by transistors contained within the bias voltage generating circuitry. Furthermore, under these conditions the prior art bias voltage generating circuitry is physically larger than is desirable and therefore increases manufacturing costs.

The foregoing variation of generated bias voltage is exacerbated when a cascode circuit (or other circuit) being biased by the generated bias voltage contains multiple types of transistors, meaning, for example, that the different transistors within the same integrated circuit are manufactured using different designed-in doping levels, oxide thicknesses, etc., yielding different intrinsic properties such as breakdown voltage and threshold voltage. The different types of transistors referred to herein as being of different "technology types" may have substantially different intrinsic properties and performance trends over chip temperature and integrated circuit manufacturing process parameters.

Figure 1A:
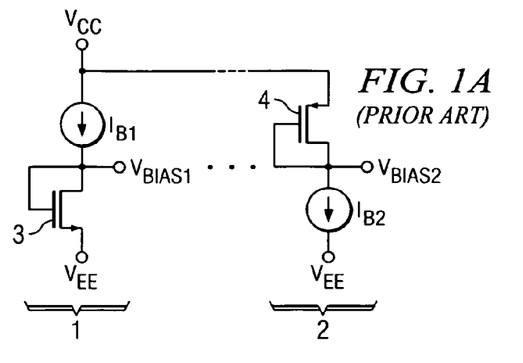
FIG. 1A is a schematic diagram showing two conventional diode-connected MOS bias voltage circuits.

Following are some specific examples of prior art bias voltage generating circuits:

FIG. 1A shows conventional bias circuitry including diode-connected transistors used for generating bias voltages $V_{BIAS1}$ and $V_{BIAS2}$ and is especially useful for biasing N-channel cascode transistors and P-channel cascode transistors, respectively. $V_{BIAS1}$ is equal to the $V_{GS}$ voltage of a diode-connected N-channel MOSFET 3 having its source connected to the lower supply voltage $V_{EE}$ and its gate and drain connected to a conductor to a bias current source $I_{B1}$, and similarly for $V_{BIAS2}$. However, the diode bias circuit of FIG. 1A has the gate width and gate length shortcomings described above, and being a single transistor, it cannot track cascode circuit systems containing different technology types of transistors.

Figure 1B:
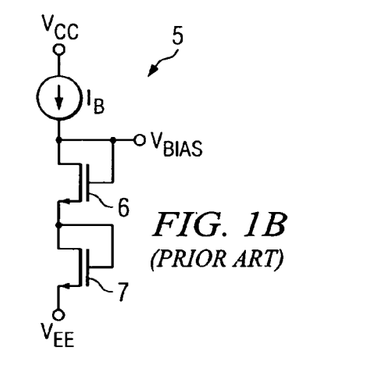
FIG. 1B is a schematic diagram of a conventional diode-connected MOS circuit which generates a bias voltage that is equal to the sum of an integral number of $V_{GS}$ voltages.

FIG. 1B illustrates another known bias circuit 5 which generates a bias voltage $V_{BIAS}$ using two (or more) "stacked" diode-connected N-channel transistors 6 and 7 coupled in series with a bias current source $I_B$. Therefore, $V_{BIAS}$ is equal to the sum of the $V_{GS}$ voltages of the stacked diode-connected transistors 6 and 7, and may produce a bias voltage, equal to the sum of two threshold voltages ($V_T$'s), which is too large in value.

Figure 1C:
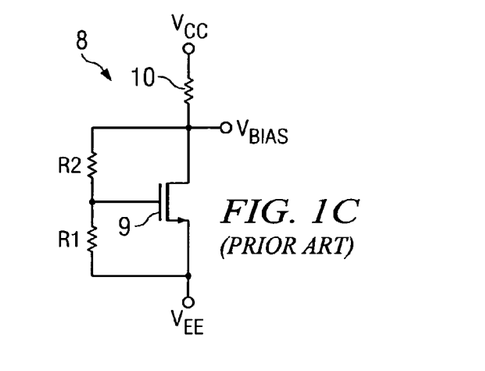
FIG. 1C shows a conventional MOS bias voltage generating circuit which produces a bias voltage equal to a non-integer multiple of a $V_{GS}$ voltage.

FIG. 1C shows a conventional bias circuit 8 which generates a bias voltage $V_{BIAS}$ that is equal to a non-integer multiple of the $V_{GS}$ voltage of N-channel transistor 9. Resistor R1 is connected between the gate of transistor 9 and $V_{EE}$, and resistor R2 is connected between the gate and drain of transistor 9, the source of which is connected to $V_{EE}$. However, the bias circuit of FIG. 1C, or any bias voltage generator including resistors and transistors, has the shortcomings of not tracking cascode transistor and signal transistors well, since the characteristics of a resistor are very different from those of a transistor.

Figure 1D:
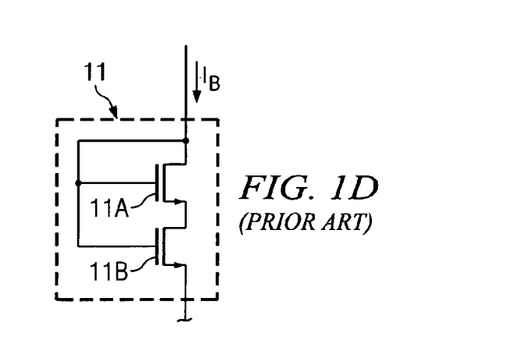
FIG. 1D shows a schematic diagram of a conventional composite transistor biased in a weak inversion region to generate a PTAT current or biased in a strong inversion region to provide fractional Vdsat voltages.
Figure 1E:
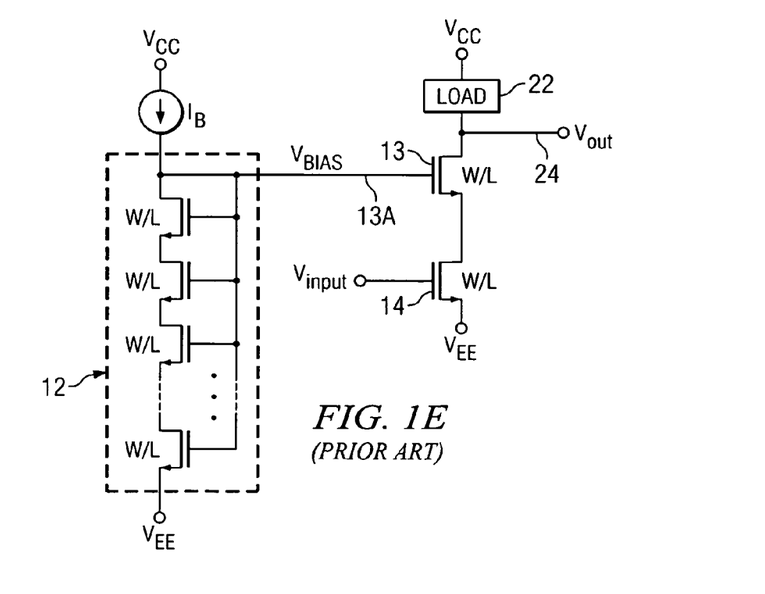
FIG. 1E illustrates a conventional composite transistor in which all of a number of series-connected transistors are included in a composite transistor to bias a cascode transistor.

FIG. 1D illustrates a known "composite" transistor 11 (shown in FIG. 2.14 of the subsequently cited Enz and Vittoz reference). In composite transistor 11, N-channel transistors 11A and 11B are connected in series, wherein the gates of transistors 11A and 11B both are connected to the drain of transistor 11A, the source of transistor 11B being coupled to $V_{EE}$. Transistors 11A and 11B are biased in a "weak inversion" region in order produce a PTAT reference voltage, i.e., a reference voltage which is proportional to the absolute temperature. However, the shortcoming is that many applications do not require PTAT voltages and this composite transistor is not useful for biasing cascode transistors and will not track the cascoded circuitry, which is typically operated in the strong inversion region. However, the Enz and Vittoz reference disclose the FIG. 1D configuration in the strong inversion region for a different purpose, to generate fractional pinch-off voltages (Vdsat), and use all the same technology type of transistors. This purpose is unrelated to that of the present invention. Also, optimal transistor gate sizes determined in accordance with the Enz and Vittoz teachings are not optimal for the purposes of the present invention.

FIG. 1E shows a bias circuit wherein a known "composite" transistor 12 includes a suitable number of N-channel transistors coupled in series between $V_{EE}$ and a conductor 13A. This circuit is shown in FIG. 2.22 of the Enz and Vittoz reference. Conductor 13A is connected to one terminal of a bias current source $I_B$ and also to the gate of a N-channel cascode transistor 13. The multiple transistors of composite transistor 12 typically all are biased in a strong inversion state, and all have the same gate-width-to-gate-length ratio (W/L ratio), which is equal to the W/L ratio of cascode transistor 13. The source of cascode transistor 13 is connected to the drain of a signal transistor 14 having its source connected to $V_{EE}$ and having its input connected to an input signal. The bias circuit of FIG. 1E has the shortcomings of being composed of all the same kind of transistors and is intended to generate the lowest voltage on conductor 13A that would keep the cascode system 13 and 14 active. Also, optimal transistor gate sizes determined for the composite transistor of FIG. 1E are not optimal for the purposes of the invention subsequently described herein.

The Galup-Montoro et al. article cited below describes a composite MOSFET (metal oxide semiconductor field effect transistor) which consists of the series connection of two transistors, as in the present invention, for example the composite transistor in subsequently described FIG. 2A. However, the composite transistor described in the Galup-Montoro et al. article has been used in low-voltage, high-frequency analog circuits. The two transistors in the Gallup-Montoro et al. composite transistor both are of the same technology type, and are not sized the same as in the present invention, nor are they used for the same purpose.

The following references provide further background:
(1) T. C. Choi, et al., "High frequency CMOS switched capacitor filters for communications applications", JSSC. Vol. SC-18, pp. 652-664. December 1983
(2) C. C. Enz and E. A. Vittoz, "Tutorial: CMOS Low-Power Analog Circuit Design", chapter 1.2. ISCAS, Atlanta, May 1996.
(3) R. Gregorian, "Introduction to CMOS Opamps and Comparators", Wiley & Sons. 1999.
(4) P. E. Allen, D. R. Holberg, "CMOS Analog Circuit Design," Oxford University Press. 1987.
(5) Galup-Montoro et al., "Series-Parallel Association of FET's for High Gain and High-Frequency Applications", IEEE Journal of Solid-State Circuits, vol. 29, no. 9, September, 1994.

It should be noted that in the above described prior art, the N-channel transistors of the bias voltage generator circuitry and the cascode circuitry biased thereby all are of the same technology type. Also, the P-channel transistors of the bias voltage generator circuitry and the circuitry biased thereby all are of the same technology type.

It is generally recognized that use of small, single MOSFETs in a bias voltage generator circuit has the drawback that if the transistor gate width W is made too small relative to the W/L ratio, to both save chip area and provide large bias voltages, then the generated bias voltage tends to vary more with respect to temperature, integrated circuit processing parameters, and power supply voltages.

Thus, there is an unmet need for high voltage integrated circuit bias voltage generating circuitry that is suitable for optimum biasing of cascode transistor circuitry including transistors of different technology types.

There also is an unmet need for circuitry to bias cascode transistor circuits which include different kinds of transistors made using different kinds of fabrication sub-technologies which provide the different kinds of transistors with different intrinsic structural characteristics.

SUMMARY OF THE INVENTION

It is an object of the invention to provide an integrated circuit bias voltage for optimally biasing cascode transistors, particularly where the cascode transistors are of different technology types than signal transistors which are being cascoded.

It is another object of the invention to provide bias voltage generating circuitry to provide optimum bias voltages for cascode circuitry including transistors of different technology types of cascode transistors in a single integrated circuit.

It is another object of the invention to provide integrated circuitry for cascode biasing, particularly in applications which need to use semiconductor technologies that include multiple kinds of transistors, such as different MOSFETs fabricated so as to have different breakdown voltages and/or threshold voltages, and/or such as bipolar transistors and field effect transistors.

Briefly described, and in accordance with one embodiment, the present invention provides an integrated circuit that includes a composite transistor (31) including at least a first transistor (31A) of a first technology type having a first group of intrinsic properties and a second transistor (31B) of a second technology type having a second group of intrinsic properties, at least one of the intrinsic properties of the second group being substantially different than a corresponding intrinsic property of the first group. The second transistor (31B) has a first electrode (e.g., a source) coupled to a supply voltage ($V_{EE}$), a second electrode (e.g., a drain) coupled to a first electrode of the first transistor (31A), and a control electrode (e.g., a gate) coupled by a bias voltage conductor (32A) to a control electrode (e.g., a gate) and a second electrode (e.g. a drain) of the first transistor (31A). A source of bias current ($I_{B1}$) is coupled to the bias voltage conductor (32A) and is also coupled to the second electrode (e.g., a drain) of the second transistor (31A). A bias voltage ($V_{BIAS1}$) across the composite transistor (31) is produced on the bias voltage conductor (32A) to bias a cascode transistor (32) of the first technology type. A second electrode (e.g., a drain) of a signal transistor (33) of the second technology type is coupled to the first electrode of the cascode transistor.

In a described embodiment, the first transistor (31A) and the second transistor (31B) are MOSFETs, and the first electrodes are sources, the second electrodes are drains, and the control electrodes are gates. In one embodiment, the composite transistor (31D, FIG. 2B) includes a third transistor (31C) coupled between the first (31A) and second (31B) transistors. The third transistor (31C) has a source coupled to the drain of the first transistor (31A), a drain coupled to the source of the second transistor (31B), and a gate coupled to the bias voltage conductor (32A).

In a described embodiment, the source of the cascode transistor (32) is coupled to a drain of a signal transistor (33) having a gate coupled to a signal voltage, and the cascode transistor (32) is of the first technology type and the signal transistor (33) is of the second technology type. A source of the signal transistor (33) is coupled to the supply voltage ($V_{EE}$), and the drain of the cascode transistor (32) is coupled to a load circuit (34) and is also coupled to an output conductor (35), wherein a signal current flows through the signal transistor (33) and the cascode transistor (32) to the output conductor (35). In the described embodiment, the first transistor (31A) and the cascode transistor (32) have the same gate-width-to-gate-length ratio, and the second transistor (31B) and the signal transistor (33) have the same gate width.

In one embodiment, the invention provides a method of biasing a cascode transistor (32) including coupling a first transistor (31A) of a first technology type having a first group of intrinsic properties in series with a second transistor (31B) of a second technology type having a second group of intrinsic properties, at least one of the intrinsic properties of the second group being substantially different than a corresponding intrinsic property of the first group. A bias current ($I_{B1}$) is forced through the first (31A) and second (31B) transistors to produce a bias voltage ($V_{BIAS1}$) across a composite transistor (31) including the first (31A) and second (31B) transistors and the bias voltage ($V_{BIAS1}$) is applied to a control electrode of the cascode transistor (32), so as to cause an intrinsic operating property of the cascode transistor (32) to track the corresponding intrinsic property of the first transistor (31A) over a predetermined range of parameters associated with an integrated circuit including the first and second transistors and the cascode transistor. A first electrode of the cascode transistor (32) can be coupled to a second electrode of a signal transistor (33), so the bias voltage ($V_{BIAS1}$) causes an intrinsic operating property of the cascode transistor (32) to track the corresponding intrinsic property of the first transistor (31A) over a predetermined range of parameters associated with an integrated circuit including the first and second transistors and the cascode transistor causes the intrinsic operating property of the signal transistor (33) to track the corresponding intrinsic property of the second transistor (31B) over the predetermined range of parameters.

In one embodiment, the invention provides an integrated circuit for biasing a cascode transistor (32), including means for coupling a first transistor (31A) of a first technology type having a first group of intrinsic properties in series with a second transistor (31B) of a second technology type having a second group of intrinsic properties, at least one of the intrinsic properties of the second group being substantially different than a corresponding intrinsic property of the first group, means for forcing a bias current ($I_{B1}$) through the first (31A) and second (31B) transistors to produce a bias voltage ($V_{BIAS1}$) across a composite transistor (31) including the first (31A) and second (31B) transistors, and means for applying the bias voltage ($V_{BIAS1}$) to a control electrode of the cascode transistor (32), so as to cause an intrinsic operating property of the cascode transistor (32) to track the corresponding intrinsic property of the first transistor (31A) over a predetermined range of parameters associated with the integrated circuit.

DETAILED DESCRIPTION OF THE PREFERRED EMBODIMENTS

The present invention provides circuitry and techniques for generating bias voltages for cascode transistors, particularly in integrated circuits having high supply voltages, wherein it is necessary to use cascode circuits in which the cascode transistor and the signal transistor being cascoded are of intrinsically and technologically different kinds of transistor technology. For example, a cascode transistor may be fabricated using one type of NMOS technology, and a signal transistor coupled in series with the cascode transistor on the same integrated circuit chip may be fabricated using another type of NMOS technology.

By way of definition, the term "cascode transistor" as used herein is intended to encompass field effect transistors connected in a common-gate amplifying configuration and bipolar transistors connected in a common-base amplifying configuration.

The term "signal transistor" is intended to encompass a field effect transistor that is connected in a common-source amplifying configuration or a bipolar transistor that is connected in a common-emitter amplifying configuration, so that the signal transistor transconducts a version of an input signal from its gate to its drain if it is a field effect transistor or from its base to its collector if it is a bipolar transistor.

The term "conductor" is intended to include any elements, including but not limited to metal conductors, which are sufficiently conductive to adequately conduct a particular signal to a particular circuit node. For example, a strip of doped polycrystalline silicon may be a "conductor" for some purposes.

Cascode transistors can perform a number of functions, including increasing the gain of an associated signal transistor, protecting or shielding the signal transistor, increasing the output resistance of the associated signal transistor, and/or mitigating the associated Miller effect.

The term "high supply voltage" as used herein refers to transistor fabrication technologies wherein the difference between an upper power supply voltage and a lower power supply voltage (i.e., $V_{CC}-V_{EE}$) is sufficiently large to support multiple transistors stacked between $V_{CC}$ and $V_{EE}$. Typically, the term "high supply voltage" is intended to mean 5 volts or more. High supply voltage transistor fabrication technologies tend to provide more than one technology type of transistor. The signal transistor may have fast signal transit frequencies but its gain may be improved by cascoding it with a different technology type of cascode transistor that can withstand the higher supply voltage and which has the additional function of preventing damage to or destruction of the signal transistor.

For "low supply voltage" applications, there may be different technology types of transistors needed in the makeup of an entire amplifier, wherein the different technology types of transistors may have different threshold voltages, for example. Some types of transistors have near-zero threshold voltages ($V_T$'s) so that a few transistors may be stacked within the $V_{CC}-V_{EE}$ supply voltage.

Different "intrinsic technology types" of transistors that may be provided on a single chip may have different drain-source breakdown voltages designed to withstand the high internal voltages that result from a high power supply voltages. Or they may have other intrinsically different properties, such as different gate-source breakdown voltages, different threshold voltages, different transit frequencies and so on. Such different intrinsic properties are normally achieved through "intrinsic structural differences" of the transistors, including, for example, different doping levels (which can affect transit frequencies and threshold voltages) and different oxide thicknesses (which can affect breakdown voltages). The layout structure or topography of a transistor may also be different, for example, by having a disproportionately larger drain area, and/or by having a closed annular gate (instead of thin gate conductors) to provide a larger breakdown voltage for the transistor.

The drawings herein provide thick lines for the MOSFET symbols of transistors which are of an intrinsically different technology type than for certain other transistors which are drawn with thin lines, all being fabricated with the same overall technology used to make the same integrated circuit. An example of more radically intrinsically different technology types of transistors is the use of field effect transistors in combination with bipolar transistors in the same integrated circuit.

Figure 2A:
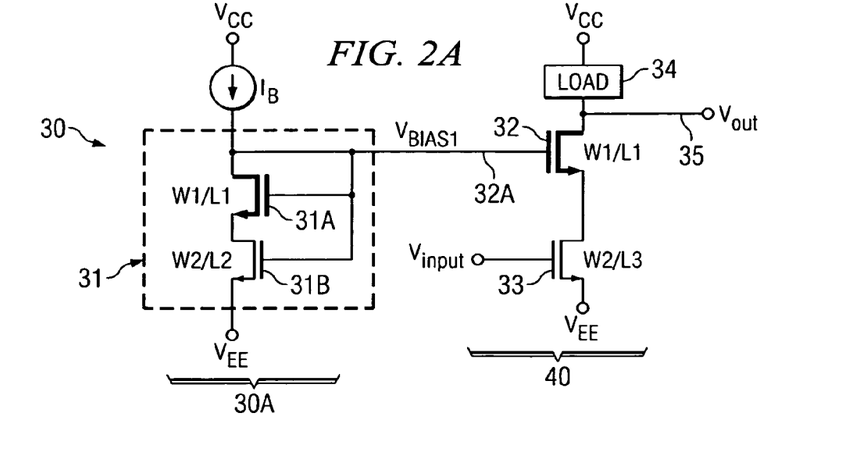
FIG. 2A illustrates a bias circuit and a cascode circuit including a composite transistor according to the present invention, for generating a bias voltage suitable for biasing a cascode transistor of a particular technology type.

FIG. 2A illustrates a circuit 30 according to the present invention including a bias voltage generator circuit 30A which generates a bias voltage $V_{BIAS1}$. Circuit 30 is designed for the above mentioned "high supply voltages". Bias voltage generator circuit 30A includes a composite transistor 31 which generates $V_{BIAS1}$ on bias voltage conductor 32A. Composite transistor 31 includes a N-channel diode-connected transistor 31A having its gate and drain connected by bias voltage conductor 32A to one terminal of a current source $I_B$. The source of transistor 31A is connected to the drain of N-channel transistor 31B, the source of which is connected to $V_{EE}$ and the gate of which is connected to bias voltage conductor 32A.

FIG. 2A also includes, as an example, cascode circuit 40, which could be included in various kinds of amplifying circuits, current mirrors, etc. Cascode circuit 40 includes a N-channel cascode transistor 32, the drain of which is connected by conductor 35 to one terminal of a load circuit 34. The gate of cascode transistor 32 is connected to receive $V_{BIAS1}$ on conductor 32A. The source of cascode transistor 32 is connected to the drain of a N-channel signal transistor 33, the source of which is connected to $V_{EE}$ and the gate of which receives a voltage Vinput. Transistor 32 can be referred to as the "cascode" of "signal transistor" 33. An output voltage Vout is produced on conductor 35. The width-to-length ratio W/L of transistor 31A is equal to the W/L ratio of cascode transistor 32, both labeled as W1/L1 as shown. The gate (or channel) width W2 of transistor 31B is equal to the gate (or channel) width W2 of signal transistor 33.

Transistor 31A and cascode transistor 32 both are of a first technology type. Transistor 31B and signal transistor 33 both are of a second technology type. For example, the two different technology types might have different threshold voltages and/or different breakdown voltages. Also, the two technology types may be different in that for one of the technology types the transistors are bipolar and for the other technology type the transistors are MOSFETs.

Diode-connected transistor 31A is operated in its saturation region and transistor 31B is operated generally in its linear region, so both transistors are operated in their strong inversion regions. Cascode transistor 32 is biased so that signal transistor 33 generally remains in a strong inversion state and also so that it remains in its saturation region.

By way of definition, a MOSFET is considered to be in its weak inversion region if its $V_{GS}$ voltage is less than its threshold voltage $V_T$, and is considered to be in its strong inversion region if its $V_{GS}$ voltage is greater than its threshold voltage $V_T$. And a MOSFET in which the channel region is strongly inverted is considered to be operating in its "linear" or "triode" region if its drain-source voltage $V_{DS}$ is less than its saturation voltage $V_{dsat}$, which is approximately equal to $V_{GST}=V_{GS}-V_T$. The drain current $I_D$ of the transistor when in its linear or triode region is given by Equation (1) below and is set equal to IB. The product of the resistance of the transistor and this current gives the voltage $V_{DS}$ across the transistor. Therefore the W and L of the transistor can be adjusted appropriately to yield a desired value of $V_{DS}$. The width W2 of the transistor 31B should be set to be the same as the width W2 of the signal transistor 33, so the gate or channel length L remains to be adjusted to yield a desired $V_{DS}$. The parameters μ and Cox are the mobility and the gate capacitance per unit area, respectively. The channel resistance between the drain and source is $R_{DS}$. The equations are as follows:

$$I_D = \mu Cox(W/L)[(V_{GS}-V_T)V_{DS}-V_{DS}^2/2] = IB \quad \text{Eq(1)}$$

$$R_{DS} = 1/[\mu Cox(W/L)V_{GS}] \quad \text{Eq(2)}$$

$$V_{DS} = IB \cdot R_{DS} = IB/[\mu Cox(W/L)V_{GS}] \quad \text{Eq(3)}$$

Similarly, a MOSFET in which the channel region is strongly inverted is considered to be operating in its "active" or "saturation" region if its drain-source voltage $V_{DS}$ is greater than its saturation voltage $V_{dsat}$. The drain current $I_D$ of the transistor when in its active or saturation region is given by the approximate equation $$I_D = (\mu Cox/2)(W/L)(V_{GS}-V_T)^2 = IB. \quad \text{Eq(4)}$$

From this, $$R_{DS} = 1/[\lambda I_D], \quad \text{Eq(5)}$$

$$V_{DS} = IB \cdot R_{DS} = IB/[\lambda I_D] = 1/\lambda \quad \text{Eq(6)}$$

The resistance and voltage across the transistor depends on properties of the transistor, embodied in a variable λ which includes the gate length L of the transistor. But since this is a diode-connected transistor, its $V_{DS}$ is not as easily varied as for transistor 31B, which is in its triode region. The $V_{DS}$ of transistor 31A is generally a little larger than the saturation voltage $V_{dsat}$ of the transistor. The overall bias voltage $V_{BIAS1}$ generated is the sum of the two $V_{DS}$ voltages:

$$V_{BIAS1} = V_{DS}(31B) + V_{DS}(31A) > V_{DS}(31B) + V_{dsat}(31A) \quad \text{Eq(7)}$$

The value of the transistor sizes for transistors 31A, 31B and 32, and hence the value of $V_{BIAS1}$, should be selected so as to keep signal transistor 33 in saturation, and normally also cascode transistor 32. Such biasing is to set the operating point of the cascode circuitry or "system" including transistors 32 and 33 in order to precisely control its small signal characteristics, such as its transconductance and output impedance, over the desired ranges of integrated circuit process parameters, temperatures, and power supply values. Because the voltages across transistors 31A and 31B involve parameters such as μ, λ, and Cox, the values of which vary somewhat over a range of desired operating conditions, it is normally necessary to run simulations with good transistor models to obtain the best choice of transistor sizes over the desired operating conditions.

It is evident that the composite transistor of the present invention will track the cascode system over process and operating conditions because the composite transistor consists of the same types of transistors as the cascode and signal transistors. A more quantitative relationship can be developed by considering current conservation down the bias leg 31 and the cascode system leg 33, 32, and using the above equations for transistors, assuming they are in the saturation region. The value of the drain-source voltage $V_{DS}(33)$ for transistor 33 is:

$$V_{DS}(33) = SQRT(k33'/k31') \cdot (SQRT(k33'/k31') - SQRT(k33'/k32')) \cdot V_{GST}(33), \quad \text{Eq(8)}$$

where k31' is the effective k' of composite transistor 31, where the variable k'=μCox (W/L). Since $V_{DS}(33)$ is a function of k31' of composite transistor 31, the value of $V_{DS}(33)$ will track with the properties (e.g., variations in carrier mobility and oxide thickness) of composite transistor 31 over desired operating conditions. The carrier mobility μ and the transistor gate oxide thickness tox vary over temperature and/or integrated circuit fabrication parameters/conditions. The mobility μ of composite transistor 31 is a linear combination of the mobility μ of its component transistors 31A and 31B. Therefore, $V_{DS}(33)$ will track the mobility μ of the individual components of the composite transistor in a direct, linear way. VDS(33) needs to be large enough so that transistor 33 remains in saturation, which thus sets some constraints on its values of W and L. In general, simulations using good transistor models are needed to help optimize the transistor sizes over different operation conditions. Simulations show that this kind of composite transistor provides a tighter range of values for VBIAS1 compared to the other prior art biasing schemes, and thereby allows the small signal characteristics of the cascode system to be controlled more precisely.

An additional advantage of the composite transistor 31 of the present invention is its layout topography, wherein with the gate widths and gate lengths of transistor 31A and cascode transistor 32 being the same, these transistors are of the same "height". They may be located precisely adjacent to each other and be neatly and compactly aligned. Similarly, with transistor 31B (and any additional transistors such as transistor 31C in FIG. 2B) and signal transistor 33 having the same gate width, they may also be precisely aligned and located in a compact area. Being able to precisely align the transistors means that gaps and dead space on the chip surface can be eliminated, thereby avoiding waste of chip area. Furthermore, the matching (tracking) of alignable transistors is improved (and even further improvement can be achieved by placing dummy replicas of these transistors on either side).

Figure 2B:
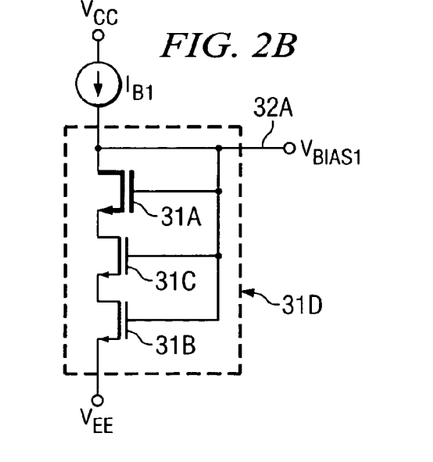
FIG. 2B is a schematic diagram of a variation of the bias circuit 30 shown in FIG. 2A.

For either P-channel or N-channel construction of the invention, additional transistors may be inserted in the chain of transistors. FIG. 2B shows a P-channel variation of bias circuit 30A of FIG. 2A in which an additional P-channel transistor 31C is connected between the source of transistor 31A and the drain of transistor 31B, with the drain of transistor 31C also being connected to conductor 32A. Transistor 31C is of the same technology type as transistor 31B. The additional transistor 31C provides a decrease in the value of $V_{BIAS1}$, however, because the combination of transistors 31B and 31C is equivalent to a single transistor of size W/2L if transistors 31B and 31C are identical. This construction is generally not as good as a single transistor for 31B and 3C, but this construction provides an additional layout choice.

Figure 2C:
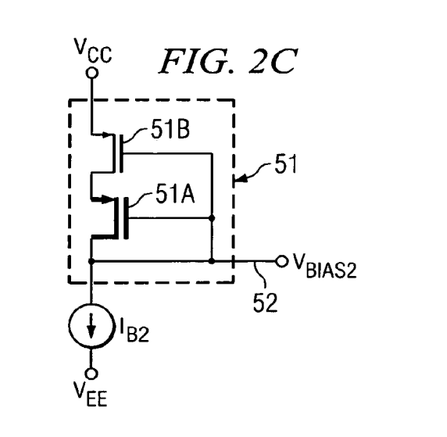
FIG. 2C is a schematic diagram of a bias circuit which is a PMOS equivalent of the bias circuit 30A in FIG. 2A.

FIG. 2C shows a bias circuit which is a P-type equivalent of the N-type bias circuit 31 in FIG. 2A, including a composite transistor 51 that includes a P-channel MOSFET 51A of one technology type having its gate and drain connected by a conductor 52 to one terminal of a current source $I_{B2}$ having its other terminal connected to $V_{EE}$. The source of transistor 51A is connected to the drain of a P-channel transistor 51B of another technology type having its source connected to $V_{CC}$ and its gate connected to conductor 52. This bias circuit produces a bias voltage $V_{BIAS2}$ on conductor 52 suitable for the gate of a P-channel cascode transistor.

Another composite transistor can be provided where there is a need to use transistors of different types, such as for a FET cascode transistor in conjunction with a bipolar signal transistor. The particular composite transistor described herein contains both technology types of transistors for use in a cascode circuit, i.e., the cascode transistors and the signal transistors. The composite transistor can provide a bias voltage which can track the variations of the performance of the main circuit being biased due to variations in temperature, integrated circuit processing parameters, and power supply voltage more accurately than the bias circuitry of the prior art.

Figure 2D:
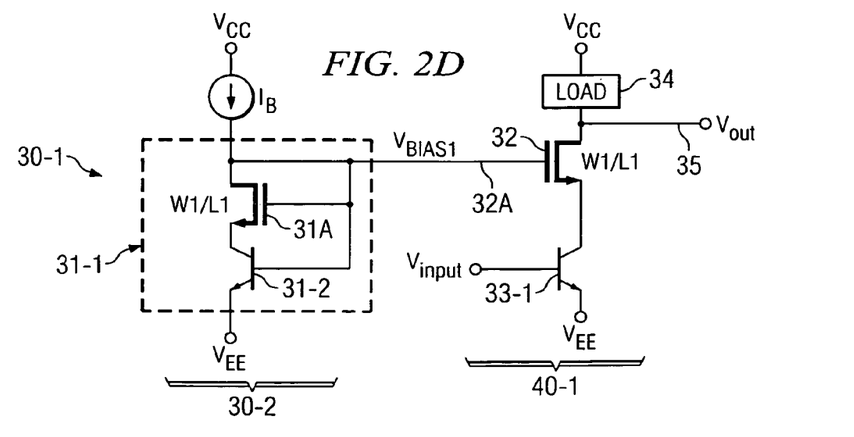
FIG. 2D is a schematic diagram of a bias circuit and a cascode circuit similar to FIG. 2A according to the present invention wherein the signal transistor and corresponding transistor of the composite transistor are bipolar transistors.

FIG. 2D shows a circuit 30-1 including a bias voltage generator circuit 30-2 which is identical to bias voltage generator 30A of FIG. 2A except that composite transistor 31-1 includes a bipolar transistor 31-2 instead of field effect transistor 33 of FIG. 2A. This configuration may be advantageous wherein the higher speed or higher gain of bipolar transistors is desired for the signal transistors.

Important applications for the described embodiments of the invention include high supply voltage integrated circuit voltage regulator circuits, power amplifier circuits, audio amplifiers, and class D amplifiers, because these integrated circuits typically include cascode transistors with large $V_{DS}$ breakdown voltages in order to withstand the high power supply voltages and a signal transistor of a different technology type. Similarly, low voltage supply wireless applications contain cascode systems involving different transistors having different threshold voltages.

The composite transistor bias circuitry including transistors of different technology types in accordance with the present invention works especially well for biasing cascode transistors in both kinds of applications. Also, by the construction of the particular W and L sizes of the component transistors of the composite transistor, the described bias circuits can precisely control the small-signal characteristics of the main circuit, and require less chip area than is required by the prior art circuits used to bias a cascode transistor. The particular W and L sizes also allow for a compact layout that also allows dummy replicas to be optimally placed so as to further enhance the matching and tracking of the biasing transistors relative to the cascode system circuitry.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. An integrated circuit comprising:
    (a) a composite transistor including at least a first transistor of a first technology type having a first group of intrinsic properties and a second transistor of a second technology type having a second group of intrinsic properties, at least one of the intrinsic properties of the second group being substantially different than a corresponding intrinsic property of the first group, the second transistor having a first electrode coupled to a supply voltage, a second electrode coupled to a first electrode of the first transistor, and a control electrode coupled to a bias voltage conductor and also coupled to a control electrode and a second electrode of the first transistor;
    (b) a source of bias current coupled to the bias voltage conductor; and
    (c) a bias voltage across the composite transistor being produced on the bias voltage conductor to bias a cascode transistor.

2. The integrated circuit of claim 1 wherein the first transistor and the second transistor are field effect transistors, and wherein the first electrodes are sources, the second electrodes are drains, and the control electrodes are gates.

3. The integrated circuit of claim 2 wherein the field effect transistors are metal oxide semiconductor transistors (MOSFETs).

4. The integrated circuit of claim 1 wherein the composite transistor includes at least a third transistor coupled between the first and second transistors, the third transistor having a first electrode coupled to the second electrode of the first transistor, a second electrode coupled to the first electrode of the second transistor, and a control electrode coupled to the bias voltage conductor.

5. The integrated circuit of claim 1 wherein a first electrode of the cascode transistor is coupled to a second electrode of a signal transistor having a control electrode coupled to a signal voltage, and wherein the cascode transistor is of the first technology type and the signal transistor is of the second technology type.

6. The integrated circuit of claim 5 wherein a first electrode of the signal transistor is coupled to the supply voltage, and wherein a second electrode of the cascode transistor is coupled to a load circuit and is also coupled to an output conductor, wherein a signal current flows through the signal transistor and the cascode transistor to the output conductor.

7. The integrated circuit of claim 5 wherein the first transistor and the cascode transistor are field effect transistors and have the same gate-width-to-gate-length ratio, and wherein the second transistor and the signal transistor have the same gate width.

8. The integrated circuit of claim 2 wherein a breakdown voltage is an intrinsic property of the first group that is substantially different than a corresponding breakdown voltage intrinsic property of the second group.

9. The integrated circuit of claim 2 wherein a field effect transistor threshold voltage is an intrinsic property of the first group that is substantially different than a corresponding field effect transistor threshold voltage intrinsic property of the second group.

10. The integrated circuit of claim 2 wherein the first and second transistors are N-channel MOSFETs and wherein the cascode transistor is a N-channel MOSFET.

11. The integrated circuit of claim 1 wherein one of the first and second transistors is a bipolar transistor wherein its first electrode is an emitter, its second electrode is a collector, and its control electrode is a base.

12. The integrated circuit of claim 1 wherein the first transistor is a field effect transistor, the cascode transistor is a field effect transistor, and the second transistor is a bipolar transistor.

13. The integrated circuit of claim 5 wherein the second transistor and the signal transistor are field effect transistors.

14. The integrated circuit of claim 5 wherein the second transistor and the signal transistor are bipolar transistors.

15. A method of biasing a cascode transistor, comprising:
    (a) coupling a first transistor of a first technology type having a first group of intrinsic properties in series with a second transistor of a second technology type having a second group of intrinsic properties, at least one of the intrinsic properties of the second group being substantially different than a corresponding intrinsic property of the first group;
    (b) forcing a bias current through the first and second transistors to produce a bias voltage across a composite transistor including the first and second transistors; and (c) applying the bias voltage to a control electrode of the cascode transistor.

16. The method of claim 15 wherein step (b) includes providing the bias voltage so as to cause an intrinsic operating property of the cascode transistor to track a corresponding intrinsic operating property of the first transistor over a predetermined range of parameters associated with an integrated circuit including the first and second transistors and the cascode transistor.

17. The method of claim 15 including coupling a first electrode of the cascode transistor to a second electrode of a signal transistor, wherein step (b) includes providing the bias voltage so as to cause an intrinsic operating property of the cascode transistor to track a corresponding intrinsic operating property of the first transistor over a predetermined range of parameters associated with an integrated circuit including the first and second transistors and the cascode transistor, and also so as to cause an intrinsic operating property of the signal transistor to track a corresponding intrinsic operating property of the second transistor over the predetermined range of parameters.

18. The integrated circuit of claim 15 wherein the first and second transistors and the cascode transistors are field effect transistors, the method including providing the first transistor and the cascode transistor with the same gate-width-to-gate-length ratio, providing a signal transistor coupled to a source of the cascode transistor wherein the signal transistor is of the same technology type as the second transistor, and providing the second transistor and the signal transistor with the same gate width.

19. An integrated circuit for biasing a cascode transistor, comprising:
(a) means for coupling a first transistor of a first technology type having a first group of intrinsic properties in series with a second transistor of a second technology type having a second group of intrinsic properties, at least one of the intrinsic properties of the second group being substantially different than a corresponding intrinsic property of the first group;
(b) means for forcing a bias current through the first and second transistors to produce a bias voltage across a composite transistor including the first and second transistors; and
(c) means for applying the bias voltage to a control electrode of the cascode transistor.

20. The integrated circuit of claim 19 including means for coupling a first electrode of the cascode transistor to a second electrode of a signal transistor, wherein the forcing means includes means for providing the bias voltage so as to cause an intrinsic operating property of the cascode transistor to track a corresponding intrinsic property of the first transistor over a predetermined range of parameters associated with an integrated circuit including the first and second transistors and the cascode transistor and also so as to cause an intrinsic operating property of the signal transistor to track a corresponding intrinsic property of the second transistor over the predetermined range of parameters.

* * * * *